(12) United States Patent
Kux et al.

(10) Patent No.: US 7,636,258 B2
(45) Date of Patent: Dec. 22, 2009

(54) INTEGRATED CIRCUITS, MEMORY CONTROLLER, AND MEMORY MODULES

(75) Inventors: Andreas Kux, Haar (DE); Detlev Richter, Munich (DE); Gert Koebernick, Dresden (DE); Juergen Engelhardt, Lauf (DE); Sudhindra Prasad, Dresden (DE)

(73) Assignee: Qimonda Flash GmbH, Dresden (DE)

( * ) Notice: Subject to any disclaimer, the term of this patent is extended or adjusted under 35 U.S.C. 154(b) by 0 days.

(21) Appl. No.: 11/955,278

(22) Filed: Dec. 12, 2007

(65) Prior Publication Data

US 2009/0154264 A1 Jun. 18, 2009

(51) Int. Cl.
*G11C 16/00* (2006.01)
(52) U.S. Cl. .............................. 365/185.18; 365/185.02; 365/185.09
(58) Field of Classification Search ............. 365/185.02
See application file for complete search history.

(56) References Cited

U.S. PATENT DOCUMENTS

| | | | |
|---|---|---|---|
| 5,485,595 A * | 1/1996 | Assar et al. ................. 711/103 |
| 5,621,687 A * | 4/1997 | Doller ................... 365/185.29 |
| 6,016,275 A * | 1/2000 | Han ....................... 365/185.29 |
| 6,230,233 B1 * | 5/2001 | Lofgren et al. .............. 711/103 |
| 6,515,909 B1 | 2/2003 | Wooldridge |
| 6,594,183 B1 * | 7/2003 | Lofgren et al. ......... 365/185.33 |
| 6,850,443 B2 | 2/2005 | Lofgren et al. |
| 7,120,729 B2 * | 10/2006 | Gonzalez et al. ............ 711/103 |
| 7,224,604 B2 * | 5/2007 | Lasser .................. 365/185.09 |
| 7,283,395 B2 | 10/2007 | Ziegelmayer |

FOREIGN PATENT DOCUMENTS

DE  10 2005 037 037 A1  1/2007

OTHER PUBLICATIONS

Shmidt, D., "TrueFFS Wear-Leveling Mechanism," Technical Note, Rev. 1.1, TN-DOC-017, May 20, 2002, pp. 1-4, M-Systems Flash Disk Poineers, Ltd.
"White Paper: SanDisk Flash Memory Cards Wear Leveling," Doc. No. 80-3600278, Oct. 2003, pp. 1-6, Sunnyvale, CA, SanDisk Corporation.

* cited by examiner

*Primary Examiner*—Tan T. Nguyen
(74) *Attorney, Agent, or Firm*—Slater & Matsil, L.L.P.

(57) ABSTRACT

In accordance with embodiments of the invention, there are provided integrated circuits, memory controller, a method for determining a level for programming or erasing a memory segment, and a method for determining a wear level score for a memory segment. In an embodiment of the invention, a method for determining a level for programming or erasing a memory segment is provided, wherein a first level for programming or erasing a memory segment is determined as a function of an initial program/erase level. Furthermore, a first updated level is determined for a subsequent program/erase operation of the memory segment and a second level for programming or erasing the memory segment subsequent to programming or erasing the memory segment is determined using the first level, wherein the second level is determined as a function of the first updated level.

21 Claims, 9 Drawing Sheets

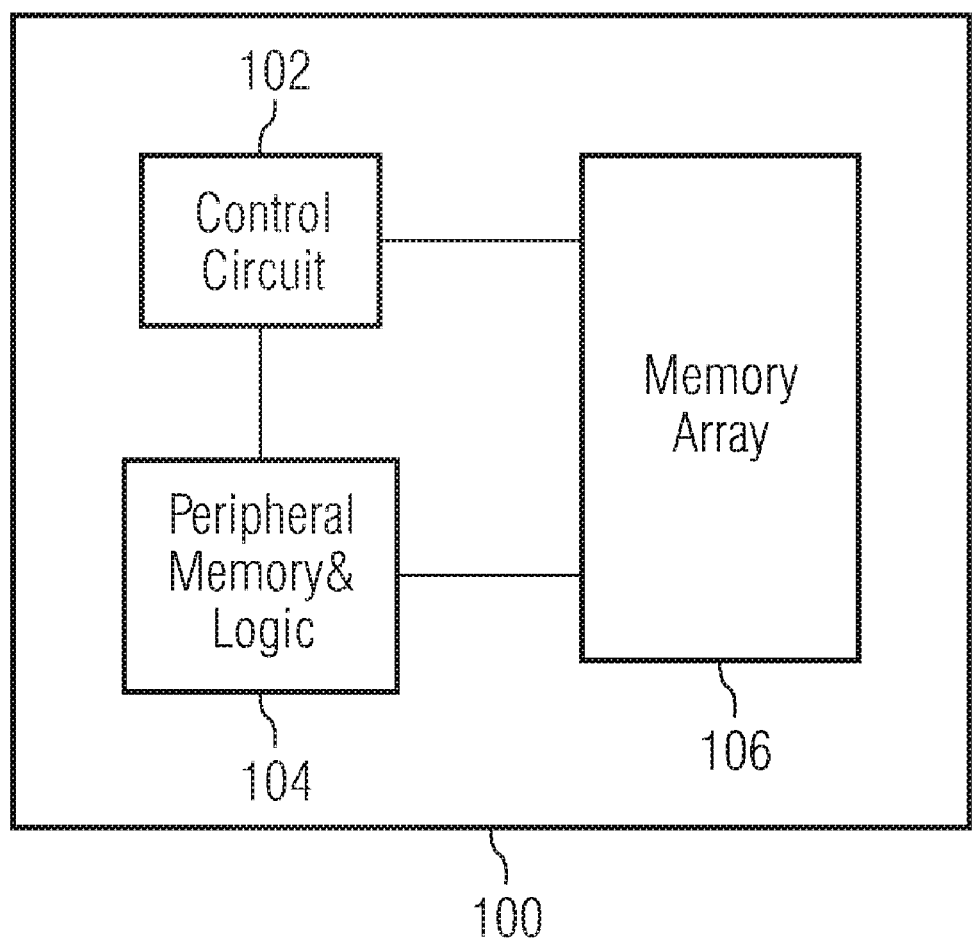

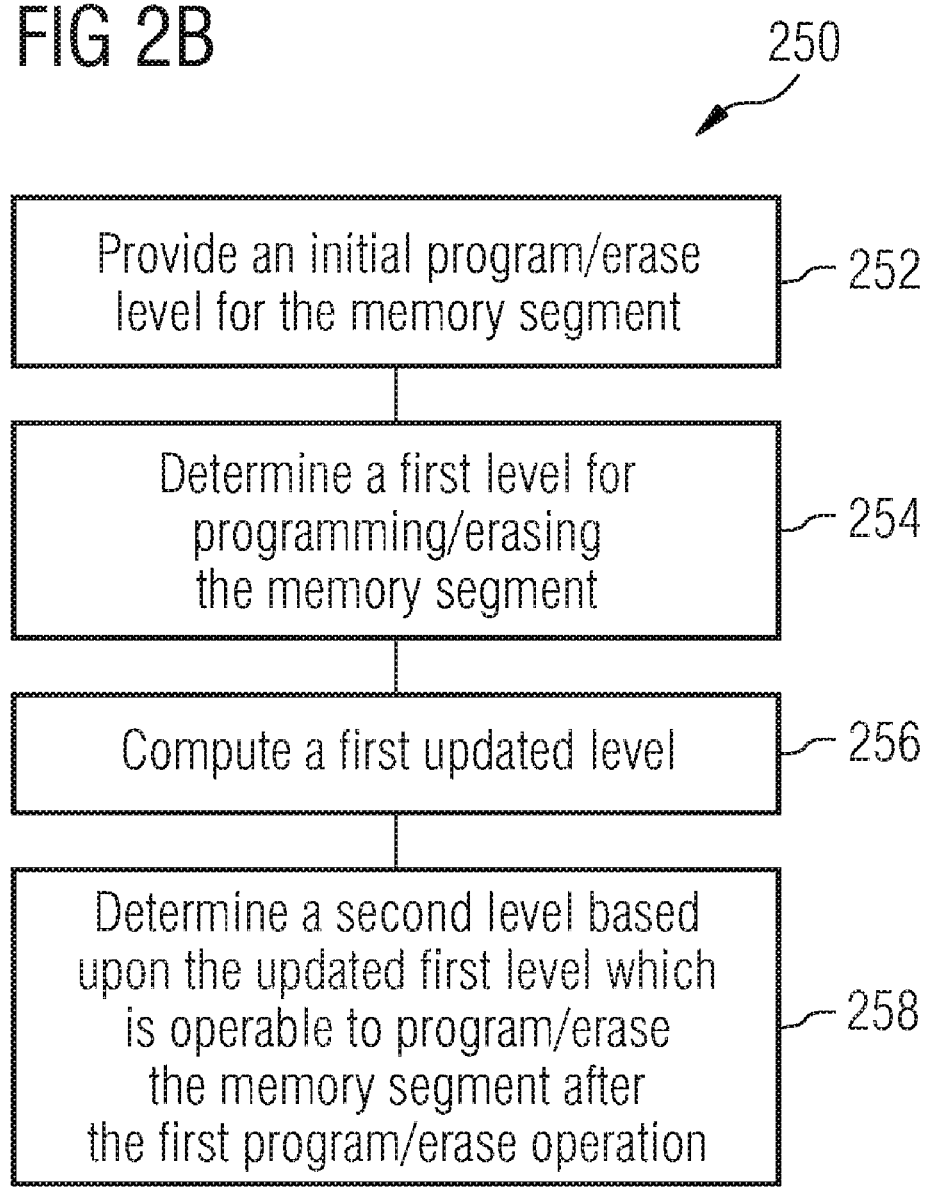

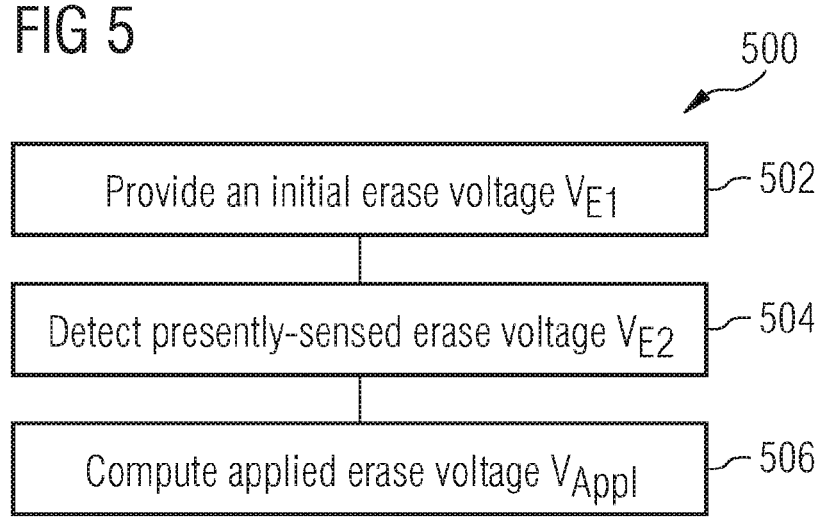
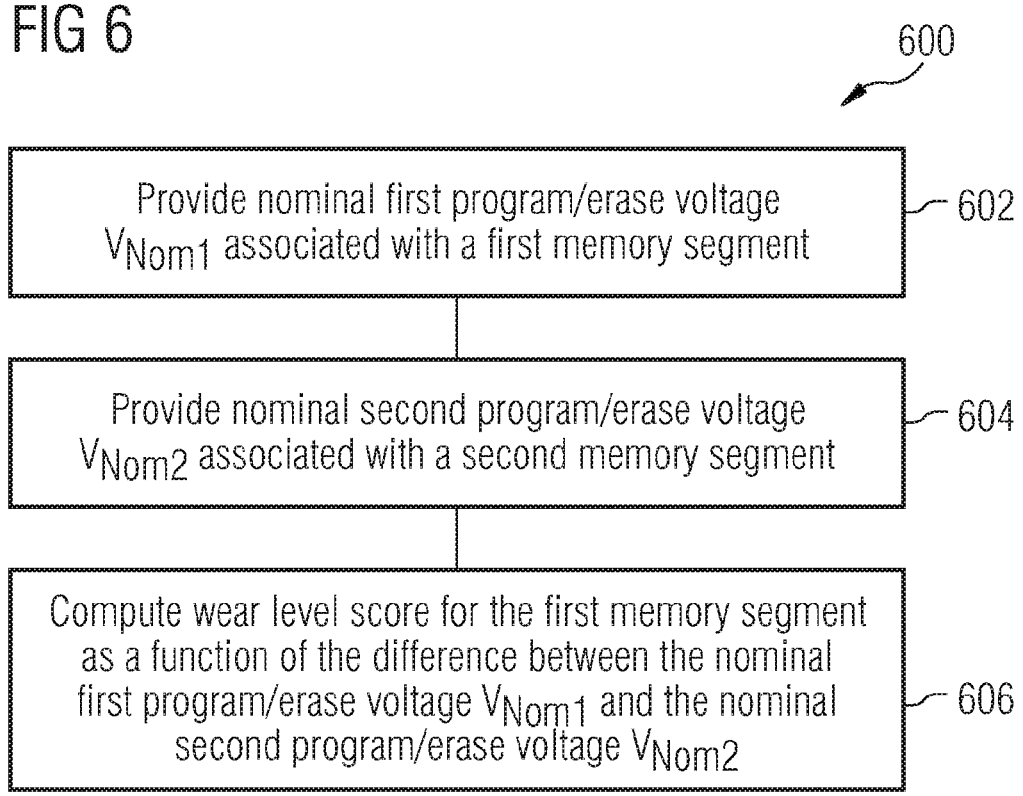

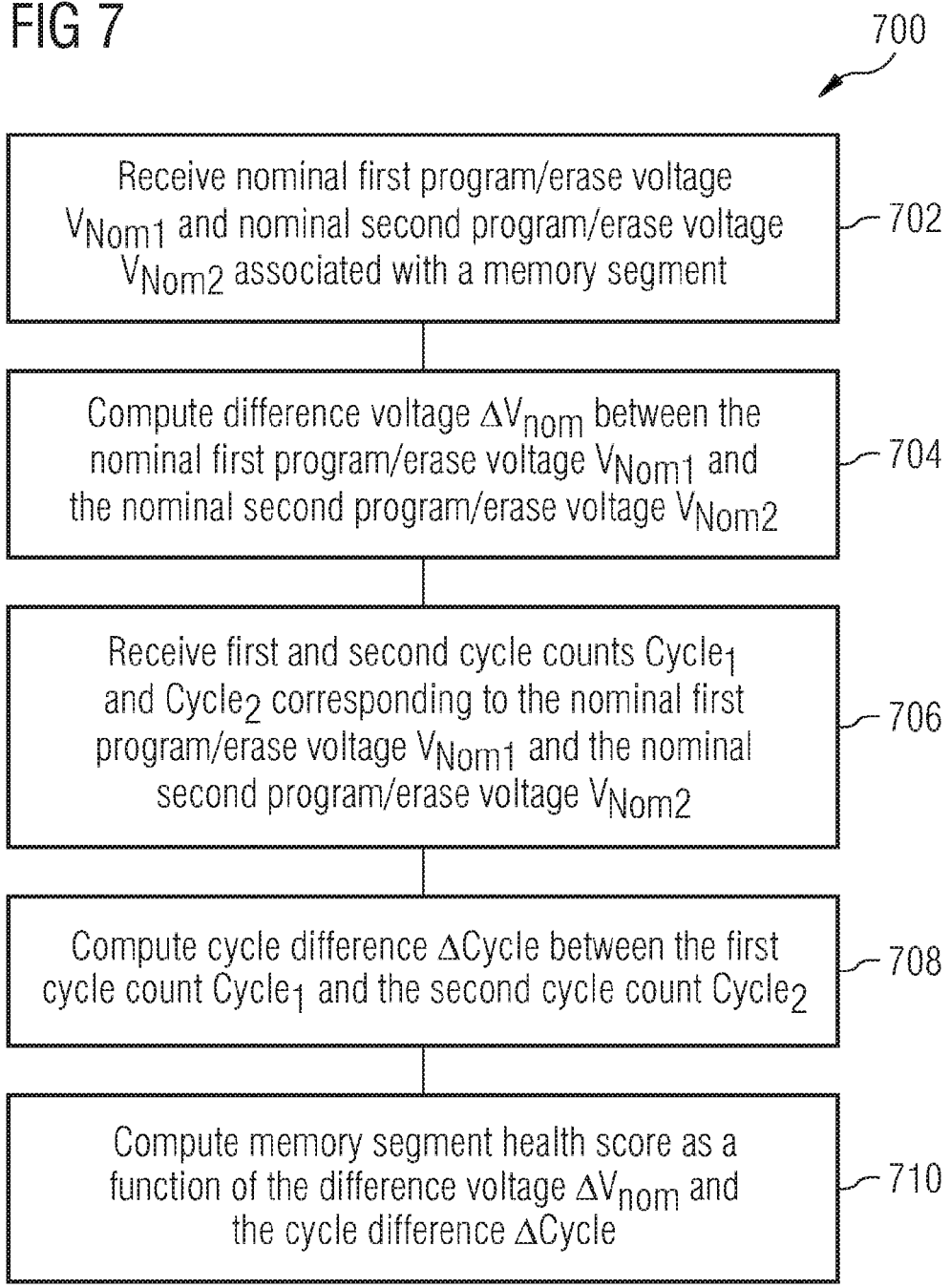

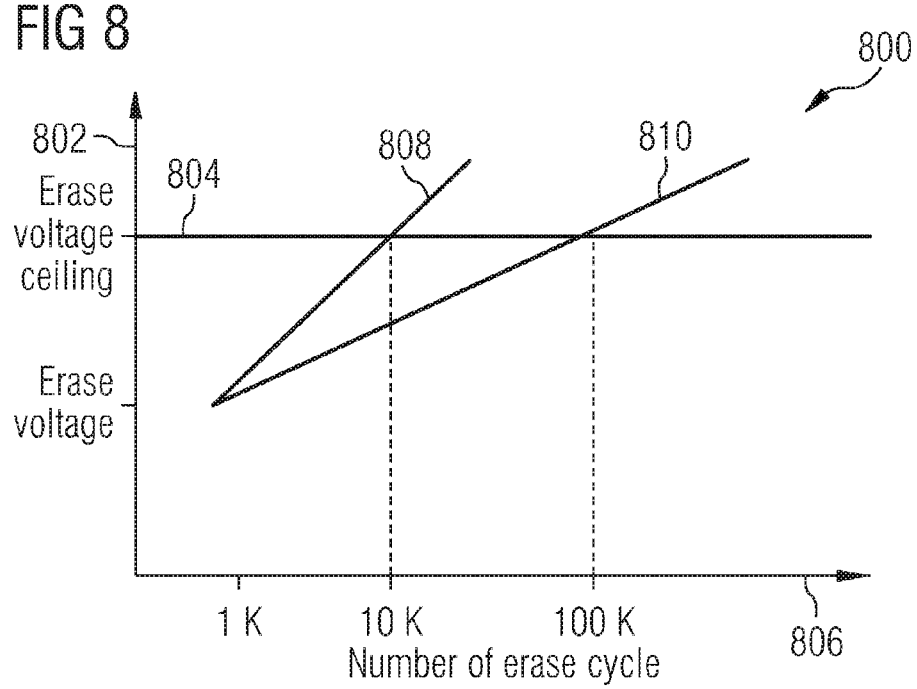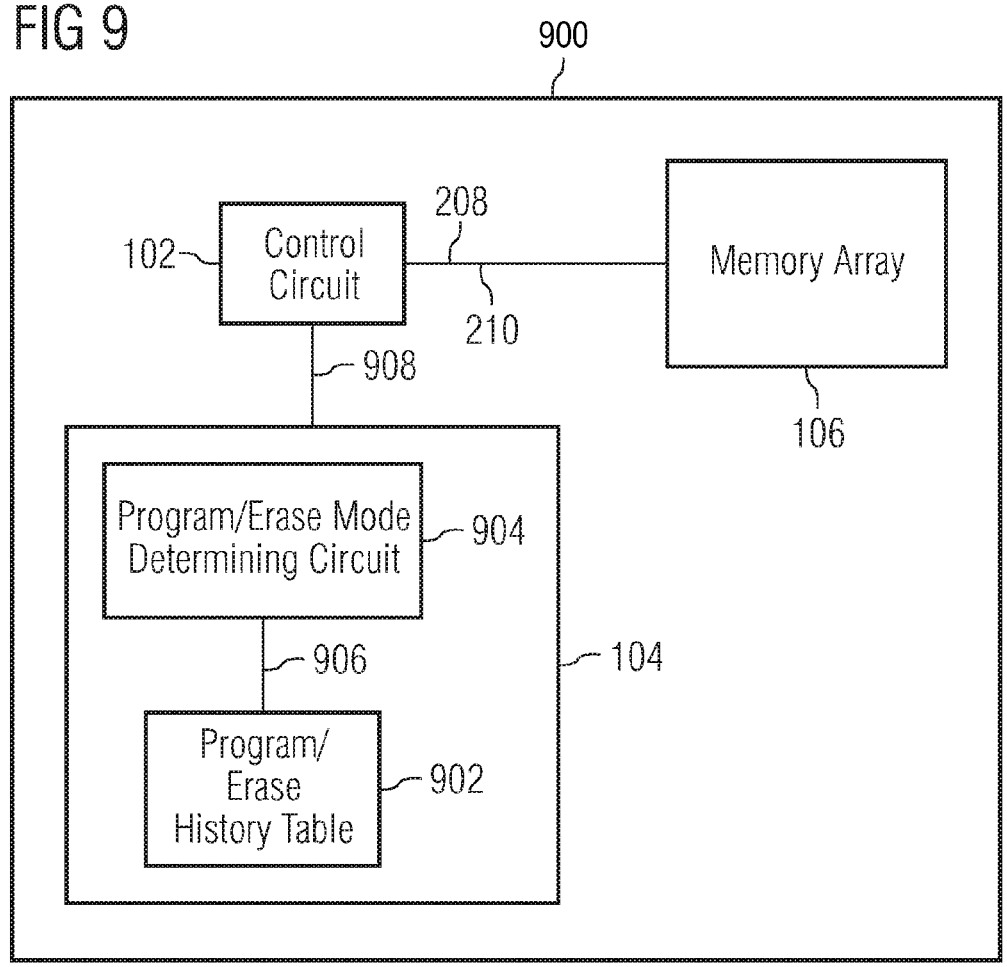

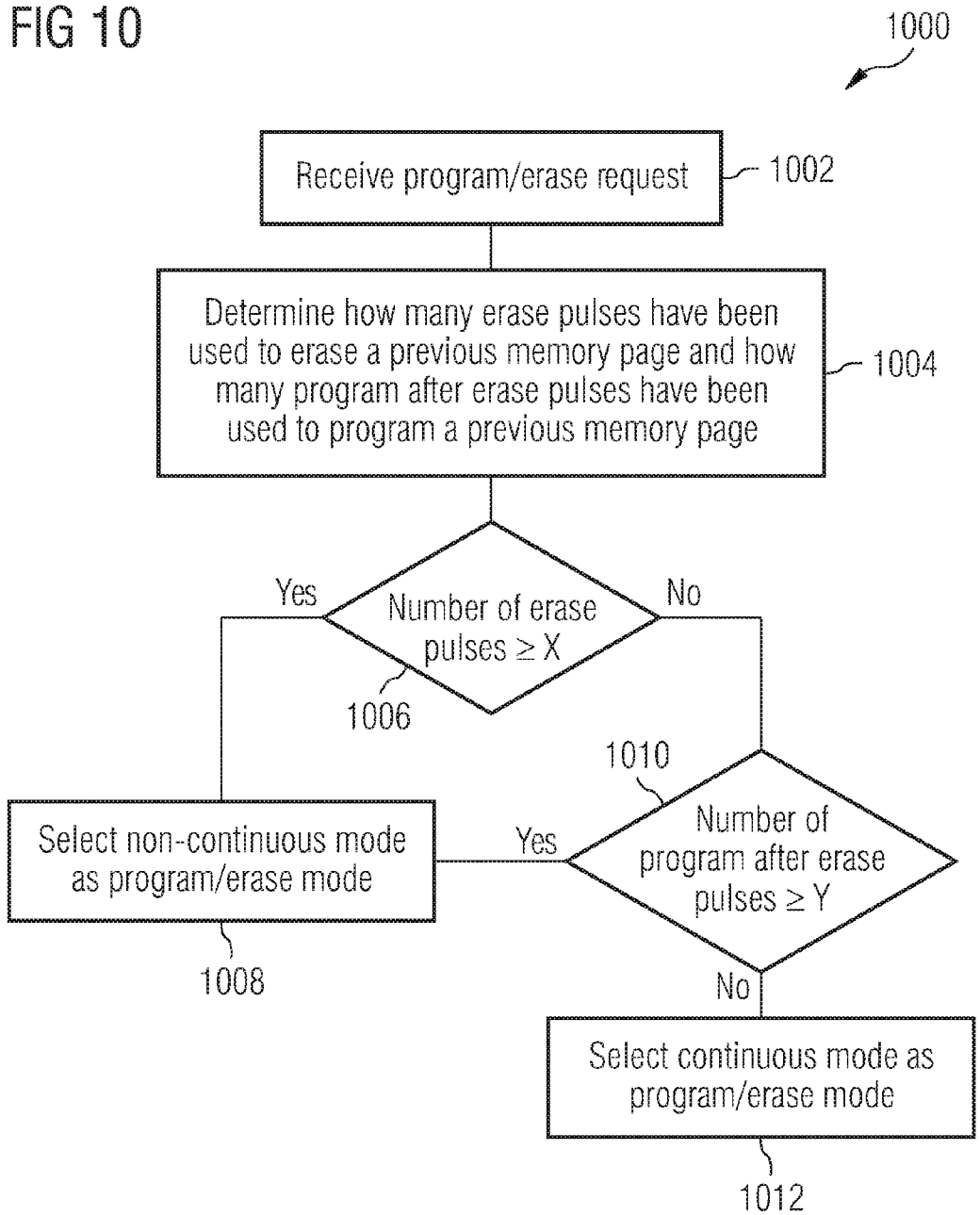

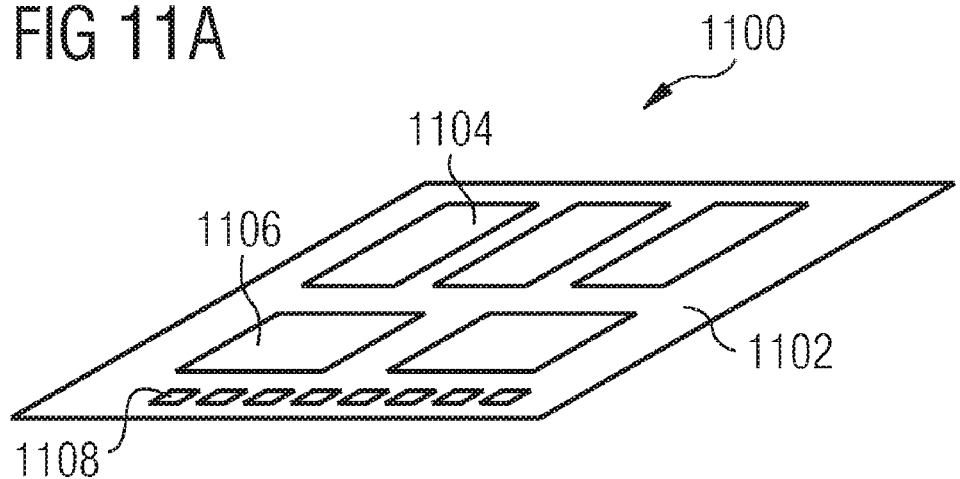
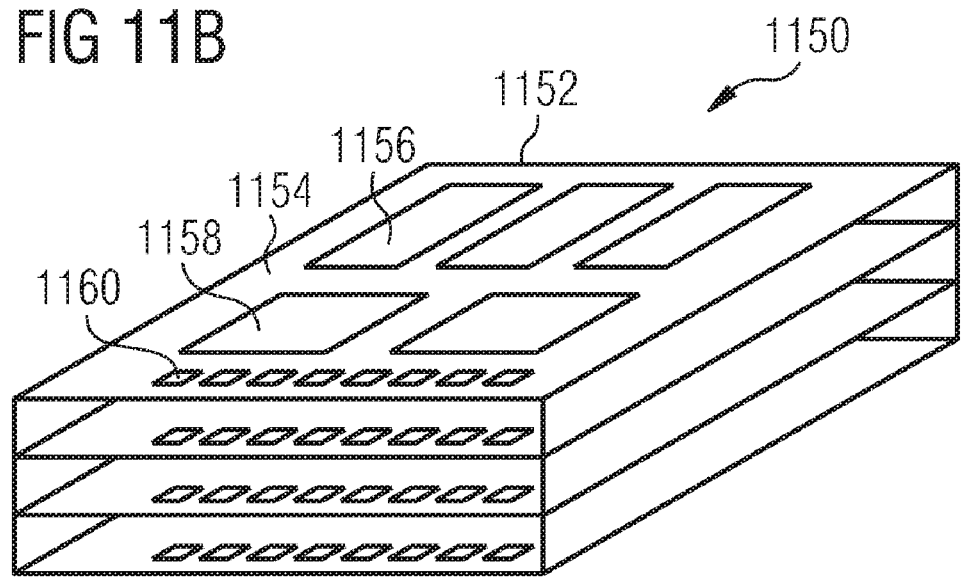

INTEGRATED CIRCUITS, MEMORY CONTROLLER, AND MEMORY MODULES

TECHNICAL FIELD

Embodiments of the invention relate generally to integrated circuits, to a memory controller, to a method for determining a level for programming or erasing a memory segment, to a method for determining a wear level score for a memory segment, and to memory modules.

BACKGROUND

Within the art of semiconductor memory devices, the portions of a memory being subjected to a high number of programming cycles and erase cycles will tend to age faster than other portions being subjected to fewer programming cycles and/or erase cycles. Non-uniform aging of a memory device may result in different programming levels and erase levels which should be generated and applied to older memory segments compared to younger memory segments, and data in the older memory segments which are approaching the end of their service lifetime might require a transfer to younger memory segments. This may result in an increase of operation overhead of the memory device.

Wear leveling may be used to provide a more uniform aging across memory segments of a memory device, whereby an approximately equal number of programming cycles and erase cycles are applied to each memory segment. As a memory segment's age is closely related to the number of programming cycles and erase cycles the memory segment experiences, applying a generally equal number of programming cycles and erase cycles uniformly across the memory device may result in a reduction of variation of the aging of different memory segments within the memory device.

While a conventional wear leveling may help in reducing memory segment-to-memory segment aging variation, a significant variation still remains. By way of example, variations in semiconductor fabrication processes and environment/operating conditions across memory segments may cause different memory segments to age at varying aging rates.

Furthermore, a memory segment's program/erase level may be defined by an intermittent condition, e.g., a power anomaly or other temporary condition, which may not persist. A program/erase operation attempted during this time may fail, and a less favorable program/erase level (e.g., a higher program/erase level than actually needed) may be used for subsequent program/erase operations. The less favorable program/erase level may result in an unnecessary reduction of the service lifetime of the respective memory segment.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a functional block diagram of a memory arrangement in accordance with an embodiment of the invention;

FIG. 2B shows an exemplary method for adapting the programming level and erase level of a memory segment after a previous programming operation or a previous erase operation;

FIG. 5 shows a flow diagram illustrating a process for determining an applied erase voltage in accordance with an embodiment of the invention;

FIG. 6 shows a method for computing wear level scoring of a memory segment in accordance with an embodiment of the invention;

FIG. 7 shows a method for ascertaining a memory segment health score in accordance with an embodiment of the invention;

FIG. 8 shows a graph illustrating the erase voltage as a function of the number of erase cycles for two different memory segments in accordance with an embodiment of the invention;

FIG. 9 shows a functional block diagram of a memory arrangement in accordance with another embodiment of the invention;

FIG. 10 shows an exemplary method for operating an integrated circuit comprising a memory controller in accordance with one embodiment of the invention; and FIGS. 11A and 11B show a memory module (FIG. 11A) and a stackable memory module (FIG. 11B) in accordance with an embodiment of the invention.

DETAILED DESCRIPTION OF ILLUSTRATIVE EMBODIMENTS

Figure 2A:
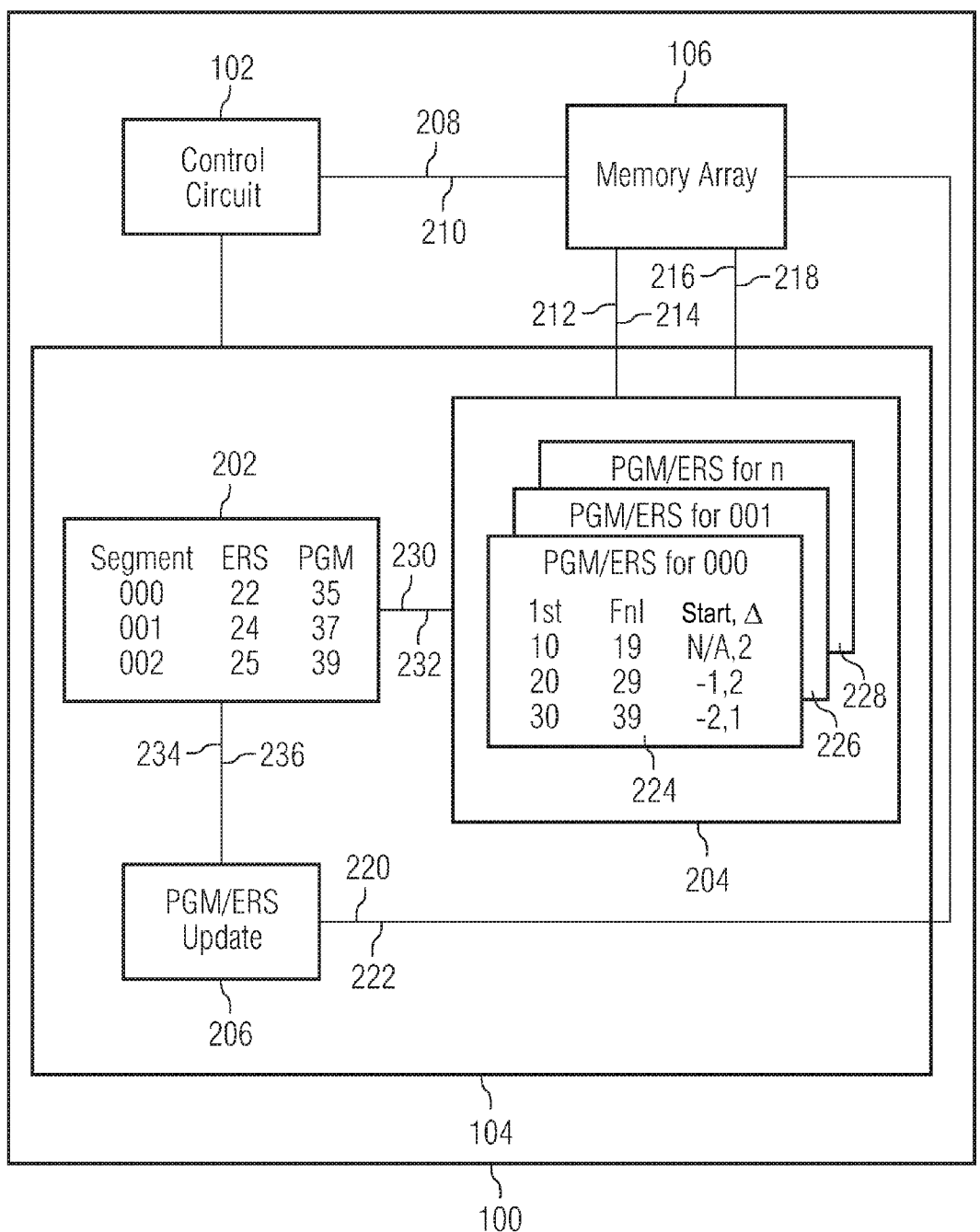
FIG. 2A shows a functional block diagram of a memory arrangement in accordance with an embodiment of the invention, wherein programming level adaptation and erase level adaptation are provided.

As used herein the terms connected and coupled are intended to include both direct and indirect connection and coupling, respectively.

In accordance with an embodiment of the invention, techniques of programming, erasing and wear leveling of one or more memory segments are provided, which take into account differences in the behavior of different memory segments and which can be resilient to intermittent program/erase level effects.

In an embodiment of the invention, a memory segment may include one or a plurality of memory cells, each memory cell being configured to store one or more bits of information.

FIG. 1 illustrates a functional block diagram of a memory arrangement 100 in accordance with an embodiment of the invention.

The memory arrangement 100 includes a control circuit 102, a peripheral memory and logic circuit 104, and a memory array 106.

The control circuit 102 is configured to control functions of the peripheral memory and logic circuit 104 and the memory array 106. In an embodiment of the invention, the control circuit 102 is configured to control the programming voltage adaptation and the erase level adaptation and wear leveling processes as they will be described in more detail below.

The peripheral memory and logic circuit 104 is configured to provide data storage and logical operations used in the programming voltage adaptation and the erase level adaptation and wear leveling processes as they will be described in more detail below.

The memory array 106 includes a plurality of memory cells, one or more of which are included within a predefined memory segment configured to store use data, computer program code and the like. The term "memory segment" as used herein may refer to a size, partition, or division of the memory array 106 within which use data, computer program code and the like can be stored. A few examples of memory segments include one single memory cell, a memory block, a memory page, a memory sector, or the entire memory array 106. In an alternative embodiment of the invention, a memory segment may be any kind of group having a plurality of memory cells, e.g., a group of memory cells that are commonly erased (e.g., in a flash memory).

The memory array 106 may have different types of memory cells. In an embodiment of the invention, the memory array 106 may have a plurality of non-volatile memory cells. In an alternative embodiment of the invention, the memory array 106 may have a plurality of volatile memory cells.

In the context of this description, a "volatile memory cell" may be understood as a memory cell storing data, the data being refreshed during a power supply voltage of the memory system being active, in other words, in a state of the memory system, in which it is provided with power supply voltage.

A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months.

The memory cells may be single-bit memory cells or multi-bit memory cells. As used herein the term "multi-bit" memory cell is intended to, e.g., include memory cells which are configured to store a plurality of bits by spatially separated electric charge storage regions, thereby representing a plurality of logic states.

Furthermore, the memory cells may be single-level memory cells or multi-level memory cells. As used herein the term "multi-level" memory cell is intended to, e.g., include memory cells which are configured to store a plurality of bits by showing distinguishable threshold voltages dependent on the amount of electric charge stored in the memory cell, thereby representing a plurality of logic states.

In an embodiment of the invention, the memory cells may be EEPROM (Electrically Erasable Programmable Read Only Memory) memory cells such as, e.g., floating gate memory cells or charge trapping memory cells. In an alternative embodiment of the invention, the memory cells may be magnetoresistive random access memory (MRAM) cells. In yet an alternative embodiment of the invention, the memory cells may be resistivity changing memory cells such as e.g. solid state electrolyte random access memory cells (e.g., conductive bridging random access memory (CBRAM) cells, also referred to as programmable metallization cell (PMC) cells), or phase change random access memory (PCRAM) memory cells, and the like.

Furthermore, the memory arrangement 100 may be implemented within a dedicated memory device, or it may be embedded within a larger system in which a memory arrangement is employed.

FIG. 2A shows a functional block diagram of a memory arrangement 100 in accordance with an embodiment of the invention, wherein programming level adaptation and erase level adaptation are provided.

The diagram illustrates the peripheral memory and logic circuit 104 and the memory array 106, each controlled by the control circuit 102. The peripheral memory and logic circuit 104 stores a program/erase history table 202, a level adaptation circuit 204 and a program/erase update circuit 206.

In an embodiment of the invention, the term "level" as, e.g., used in the expression "program/erase level" is used to refer to one or more parameters of a programming signal or of an erase signal, including, e.g., the signal's voltage amplitude, the signal's current amplitude, the signal's phasing, the signal's pulse width, the signal's pulse repetition rate, and other parameters which the signal may include.

The program/erase history table 202 is a memory/data structure which is configured to store values representative of one or more initial program/erase levels, wherein the initial program/erase levels provide a starting basis from which a successfully applied program/erase level is determined. The initial program/erase level itself may be a predefined level, for example an erase level which has been determined during the start-up or qualification process as operable to erase the memory segment. In another embodiment of the invention, the initial program/erase level may be an updated program/erase level which has been determined by means of the program/erase update circuit 206, the process of which will be described in more detail below.

The control circuit 102 controls programming operations or erase operations or read operations on the memory cells of the memory array 106 by applying programming signals 208 to the memory cells of the memory array 106 and by receiving read signals 210 from the memory cells of the memory array 106.

In an embodiment of the invention, values (e.g., a numeric value in the range of 0 to 63 corresponding to a 6-bit word) corresponding to an initial program level (shown in FIG. 2A under the heading PGM in the program/erase history table 202) and to an initial erase level (shown in FIG. 2A under the heading ERS in the program/erase history table 202) are stored for each memory segment. Further, only one value (e.g., the value 22 for the erase level) is shown for each memory segment, wherein the indicated value represents the last entered value for the particular program/erase level and the memory segment. In an alternative embodiment of the invention, two or more values (e.g., the two most recent entries) may be stored for the initial program/erase levels for each memory segment. Furthermore, in yet an alternative embodiment of the invention, the program/erase history table 202 may include only erase levels or only programming levels. Still alternatively, one program/erase level may be used for multiple memory segments. The detailed operation of the program/erase history table 202 and the implementation of the initial program/erase levels will be described below.

The level adaptation circuit 204 is a memory/data structure which is operable to store one or a plurality of procedures for adapting initial program/erase levels 230, 232 into candidate program/erase levels 212, 214, wherein the candidate program/erase levels 212, 214 are suspected of being operable to program or erase the desired memory segment. In an embodiment of the invention, the level adaptation circuit 204 includes a stored page 224, 226, 228 for each memory segment of the plurality of memory segments 000, 001, . . . , n. Within each page 224, 226, 228, a range of values of the initial program/erase levels 230, 232 are listed (shown in FIG. 2A under the headings "1st" and "Fn1" of the first column and the second column of the respective page 224, 226, 228), and the corresponding protocol (in other words, adaptation rule) for deriving the candidate program/erase levels 212, 214 indicated under the third column (shown in FIG. 2A under the heading "Start, A" of the third column of the respective page 224, 226, 228). Referring to the first table entry of the page 224 for the memory segment 000 as an example, initial program/erase levels 230, 232 having a value from 10 to 19 are generated directly as candidate program/erase levels 212, 214, and no adaptation procedure is used in this case (since the applied protocol is indicated as "N/A" in the third column of the page 224). If erasure of the memory segment fails using the supplied erase level, e.g., the supplied erase voltage level, a signal 216 is communicated to the level adaptation circuit 204, and the previous candidate erase level 212 is incremented by two units (indicated by the value "2" under the heading A in the third column of the page 224), and a new candidate erase level 214 is applied. If the erase operation using the new candidate erase level 214 is successful in erasing the memory segment 000, it is deemed as the first level 220 and is forwarded to the program/erase update circuit 206.

Referring now to the second table entry (second row of the page 224), a value of the first candidate program/erase levels 212, 214 or the memory segment 000 ranging from 20 to 29 undergoes a protocol, according to which the pulse width of a candidate program/erase level 212 is reduced by one unit from the pulse width included within an initial program/erase level 230, 232 (indicated by the value "−1" under the heading "Start" in the third column of the page 224), and the reduced candidate program/erase level 212 is output to the memory array 106 to attempt to erase the selected memory segment, e.g., the memory segment 000. As described above, if the erase operation of the memory segment fails using the reduced candidate program/erase level 212, a signal 216 is communicated from the memory array 106 to the level adaptation circuit 204, and the pulse width of the previous candidate program/erase level 212 is increased by two units (indicated by the value "2" under the heading "Δ" in the third column of the page 224), and a new candidate erase level 214 is applied. If the applied new candidate erase level 214 is successfully used in erasing the memory segment, it is deemed as the first level 220 and is forwarded to the program/erase update circuit 206.

As will be understood by the persons skilled in the art, different protocols may be applied in alternative embodiments, depending, e.g., upon the type of signal (e.g., program or erase), as well as the magnitude of the initial program/erase levels or initial program/erase level applied. Exemplary embodiments of this process will be described further below.

The program/erase update circuit 206 is a memory/data structure which is operable to compute an updated first level 234 based upon a first level 220 received from the level adaptation circuit 204. The computation of the updated first level 234 may be based upon the value of the initial program/erase levels 230, 232, the first level 220, or a combination of these signals. The computation process is further illustrated below.

FIG. 2B illustrates a method 250 for adapting the programming level or erase level (also commonly referred to as program/erase levels) of a memory segment after a previous programming operation or a previous erase operation in accordance with an embodiment of the invention.

At 252, an initial program/erase level (e.g., the initial program/erase level 230) is provided for programming or erasing a selected memory segment. In an embodiment of the invention, the initial program/erase level is predefined, and may be determined upon start-up/qualification process of the memory segment to provide an initial programming voltage or an initial erase voltage for the memory segment, for example. In another embodiment of the invention, the initial program/erase level is a previously-computed updated level (for example, the updated first level 234). In still another embodiment of the invention, the initial program/erase level is user-supplied.

Figures 3, 4:
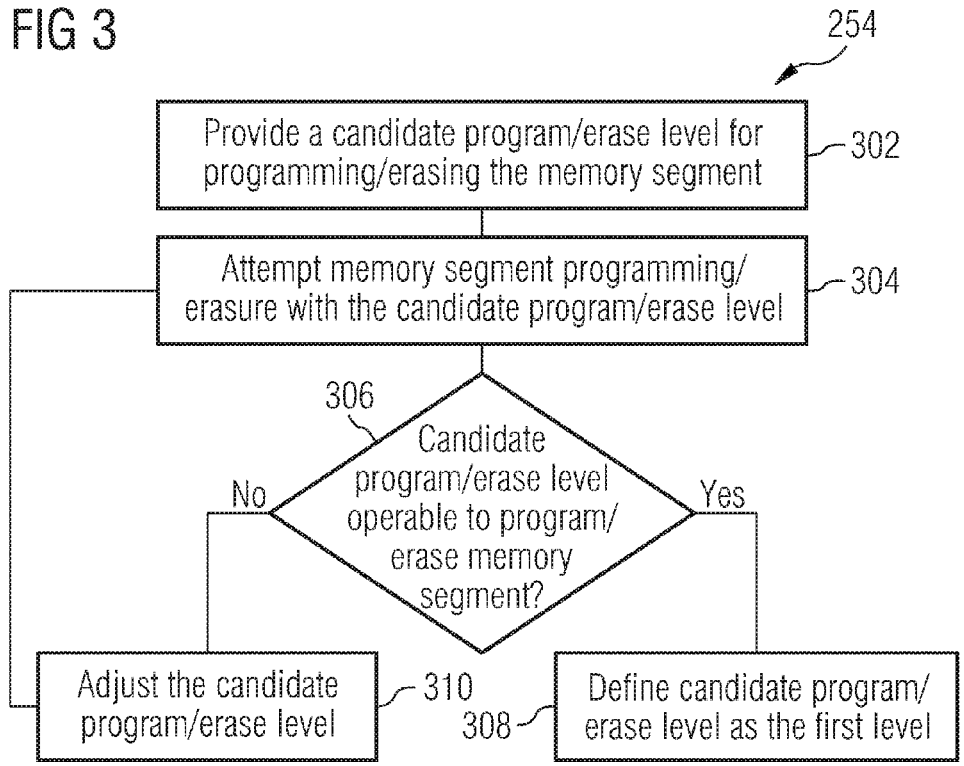
FIG. 3 shows an exemplary embodiment of the process for determining a program/erase level of a memory segment based upon a previously-defined program/erase level in accordance with the present invention.
FIG. 4 shows an exemplary embodiment of a data structure for use in computing wear level scores in accordance with an embodiment of the invention.

At 254, a first level (e.g. the first level 220) is determined as being operable to program or to erase the memory segment, wherein the first level may be determined as a function of the initial program/erase level (e.g., the initial program/erase level 230). An exemplary embodiment of this process is shown in FIG. 3 and will be described in more detail below.

At 256, an updated first level (e.g., the updated first level 234) is computed and stored in the program/erase history table 202 for use as an initial program/erase level for a subsequent operation, e.g., for a subsequent programming operation or for a subsequent erase operation. In a specific embodiment of the process 256, the updated first level is computed as a function of the difference between the initial program/erase level (e.g., the initial program/erase level 230) and the first level (e.g., the first level 220). In one instance, the process 256 includes applying a predefined offset to the voltage amplitude of an initial erase signal (e.g., the initial program/erase level 230), when the difference between the first (erase) signal (e.g., the first level 220) and the initial erase signal (e.g., the initial program/erase level 230) exceeds a predefined difference. As an example, an updated erase voltage (e.g., the updated first level 234) is limited to a predefined voltage level (e.g., two units) above the initial erase voltage level (e.g., the initial program/erase level 230), if the difference between the first erase voltage (e.g., the first level 220) and the initial erase voltage level (e.g., the initial program/erase level 230) is too great (e.g., four units). This process places a predefined limit on the variation allowed between successive programming operations or successive erase operations. As a subsequent program/erase level will be based upon the updated first level (e.g., the updated first level 234), allowing a limited variation in the updated first level will prevent the program/erase level for changing too rapidly.

Further particularly within this embodiment, the updated first level (e.g. the updated first level 234) may be computed as the first level (e.g., the first level 220) when the difference between the first level and the initial program/erase level does not exceed a predefined threshold. For example, when the difference between the first erase voltage (e.g., the first level 220) and the initial erase voltage (e.g., the initial program/erase level 230) is two units or less, the updated erase voltage (e.g., the updated first level 234) may be defined as the first erase voltage (e.g., the first level 220).

In a further embodiment of process 256, the updated first level (e.g., the updated first level 234) may be computed as an average value between the first level (e.g., the first level 220) and the initial program/erase level (e.g., the initial program/erase level 230). This process permits a convergence of a subsequent program/erase level (e.g., a subsequent program/erase level 222) towards the indicated signal level, while preventing large program/erase level variations for subsequent operations.

It will be understood that the aforementioned example can be applied to programming operations as well as to erase operations. In programming operations, an updated programming level may be limited to a predefined offset from the initial program level if the difference between the first program voltage (e.g., the first level 220) and the initial program voltage (e.g., the initial program/erase level 230) is too great.

Moreover, the computation of the updated first level (e.g., the updated first level 234) may be based upon the first level (e.g., the first level 220) (instead of the initial program/erase level (e.g., the initial program/erase level 230)), the result being that the predefined offset would be applied to the first level, instead of the initial program/erase level as described above.

The predefined offset and difference quantities described in the process 256 may include other signal parameters, for example, signal phase, pulse width, pulse repetition rate, and the like. For example, the updated first level (e.g., the updated first level 234) may be an updated erase level, in which case the process 256 may involve the process of offsetting (increasing or decreasing) a voltage amplitude of the initial erase signal (e.g., the initial program/erase level 230) by a predefined amount to ascertain the updated erase signal (e.g., the updated first level 234). In another example, the process 256 may involve the process of offsetting a pulse width of the initial erase signal (e.g., the initial program/erase level 230) by a predefined amount to ascertain the updated erase signal (e.g. the updated first level 234). In still another embodiment of the invention, the process 256 may involve the process of offsetting the pulse repetition rate of the initial erase signal (e.g., the initial program/erase level 230) by a predefined amount (e.g., increasing or decreasing the number of pulses per time unit) to obtain the updated erase signal (e.g., the updated first level 234). Those skilled in the art will appreciate that other signal parameters, for an erase signal or for a programming signal, may be used as well.

At 258, a second level (e.g., the subsequent program/erase level 222) is determined as being operable to program or erase the memory segment subsequent to the programming or the erasure of the memory segment using the first level (e.g., the first level 220), wherein the second level (e.g., the subsequent program/erase level 222) is determined as a function of the updated first level (e.g., the updated first level 234). In a particular embodiment of this process, the processes 252 and 254 may be repeated, whereby the repetition of the process 252 may involve providing the updated first level (e.g., the updated first level 234), and the repetition of the process 254 may involve determining a second level (e.g., the subsequent program/erase level 222) as a function of the updated first level. The process 256 may also be repeated, whereby an updated second level (e.g., an updated second level 236) is computed and stored in the program/erase history table 202 for use as an initial program/erase level for a subsequent operation. The above mentioned processes may apply in this repetition in which the updated second level (e.g., the updated second level 236) is computed as a function of the difference between the updated first level (e.g., the updated first level 234) and the second level (e.g., the subsequent program/erase level 222).

FIG. 3 illustrates an exemplary embodiment of the process 254 for determining a program/erase level of a memory segment based upon a previously-defined program/erase level in accordance with the present invention. The process is shown in terms of a first level (e.g., the first level 220) being computed as a function of an initial program/erase level (e.g., the initial program/erase level 230), but the terms "initial" and "first" are relative, indicating only that the initial program/erase level is defined prior to the first level.

At 302, a first candidate program/erase level 212 is selected, at which erasure or programming of the memory segment is attempted. In one embodiment of the invention, the first candidate program/erase level 212 is provided by the level adaptation circuit 204, wherein the particular level is defined by the procedures within the page 224 corresponding to the selected memory segment.

At 304, programming or erasure of the memory segment is attempted using the first candidate program/erase level 212, and at 306, a determination is made as to whether the programming operation or the erase operation has been successful. If the desired programming operation or the desired erase operation is accomplished ("Yes" in 306), the first candidate program/erase level 212 is supplied to the program/erase update circuit 206 as the first signal (e.g., as the first level 220) in 308.

If, at 306, the intended programming function or the intended erase function is not accomplished using the first candidate program/erase level 212 ("No" in 306), e.g., by sensing a program/erase failure signal 218 provided by the memory array 106, the process continues at 310, where the first candidate program/erase level 212 is adjusted to a second candidate program/erase level 214.

The process 304 is repeated to determine if the desired programming or erasure has been accomplished using the second candidate program/erase level 214. If this is the case, the second candidate program/erase level 214 is defined as the first level 220 in 308.

Adjustment of the candidate program/erase levels 212, 214 can be accomplished in several ways. In one embodiment of the invention, the voltage level is adjusted, e.g., the voltage level is increased after a failed erase attempt. In another embodiment of the invention, the pulse width is increased after a failed erase attempt. In still another embodiment of the invention, the pulse repetition rate is varied, e.g., increased, after a failed erase attempt. It will be understood that other signal parameters may be used alternatively or in addition to the aforementioned signal parameters in accordance with alternative embodiments of the invention.

As noted above, in one embodiment of the invention, the program/erase history table 202 and the level adaptation circuit 204 are configured to store both erase level data and program level data, and each of the program/erase levels 230, 232, 212, 214, 220, 222, 234, and 236 may be either an erase signal or a programming signal, thereby permitting adaptation of erase levels or of programming levels. As further noted, the level adaptation circuit 204 may employ different procedures for generating candidate erase levels compared to generating candidate program levels. Still further, the level adaptation circuit 204 may implement different procedures for generating program-before-erase (PBE) levels, as well as program-after-erase (PAE) levels when these types of signals are needed.

In another embodiment of the invention, either program data or erase data is used in the program/erase history table 202 and in the level adaptation circuit 204, wherein the program data or erase data represent that data requiring the greatest degree of granularity or smallest step size in the level adaptation process. As an example, it is assumed that the adaptation of the erase level requires the greatest degree of granularity and the smallest step size, because the memory segment is more prone to over-erasure than over-programming. In such an instance, the program levels for the memory segment are adapted using erase level data (e.g., 22 for the memory segment 000) in the program/erase history table 202, and an erase protocol in the level adaptation circuit 204. In such an embodiment, the level adaptation circuit 204 will further include a function to translate the candidate erase level to a candidate program level. In this manner, the program voltage will be adapted as needed, albeit the change/step size will be in accordance with the erase procedure.

FIG. 4 illustrates an exemplary embodiment of a data structure 400 for use in computing wear level scores in accordance with an embodiment of the invention. The data structure 400 includes a first table 418 storing erase level voltages for a first memory segment, and a second table 420 storing erase level voltages for a second memory segment. The data structure 400 may include an arbitrary number of tables.

The first table 418 includes a first column 402 of a first erase level, a second column 404, a third column 406 of maximum offset voltages, a fourth column 408 indicating the erase cycle number of the performed operation, and a fifth column 410 of applied voltages $V_{Appl}$. Three applied erase voltage computations are shown corresponding to rows 412, 414, 416.

During the first computation along the first row 412, a predefined value of 4.0 V is provided as an initial previously-permitted erase voltage $V_{E1}$ during the process 502 (see flow diagram 500 shown in FIG. 5). At 504, a voltage $V_{E2}$ of 5.0 V is detected as the presently-sensed erase voltage. At 506, an erase voltage $V_{Appl}$ to be applied of 4.4 V is computed, based on the difference between the initial previously-permitted erase voltage $V_{E1}$ and the presently-sensed erase voltage $V_{E2}$ (5.0 V–4.0 V=1.0 V), and limited to the maximum offset of 0.4 V from $V_{E1}$ as shown in the third column 406. Thus, the erase voltage $V_{Appl}$ to be applied results to 4.4 V, as shown in the fifth column 410 of the first table 418. In particular, the applied erase voltage $V_{Appl}$ is computed toward the presently-sensed erase voltage $V_{E2}$, but the adaptation is limited to the predefined maximum offset of 0.4 V from the previously-permitted erase voltage $V_{E1}$ of 4.0 V.

A second erase voltage computation begins at the second row 414, wherein the previously-computed erase voltage of 4.4 V in the fifth column 410 and the first row 412 is used as the new previously-permitted erase voltage $V_{E1}'$ in the second computation. At 504, the presently-sensed erase voltage $V_{E2}$ remains 5.0 V. At 506 in the second computation, a new erase voltage $V_{Appl}'$ to be applied is computed at 4.8 V, based upon the difference between the new previously-permitted erase voltage $V_{E1}'$ and the presently-sensed erase voltage $V_{E2}$ and the predefined limit of 0.4 V. In particular, the new erase voltage $V_{Appl}'$ to be applied is computed toward the presently-sensed erase voltage $V_{E2}$, but limited to the predefined offset of 0.4 V from the new previously-permitted erase voltage $V_{E1}'$ of 4.4 V.

A third erase voltage computation begins at the third row 416, wherein the previously-computed erase voltage of 4.8 V in the fifth column 410 and the second row 414 is used as the new previously-permitted erase voltage $V_{E1}''$ in the third computation. At 504, the presently-sensed erase voltage $V_{E2}$ remains 5.0 V. At 506 in the third computation, a new erase voltage $V_{Appl}''$ to be applied is computed at 5.0 V, based upon the difference between the new previously-permitted erase voltage $V_{E1}''$ and the presently-sensed erase voltage $V_{E2}$ and the predefined limit of 0.4 V. In particular, the new erase voltage $V_{Appl}''$ to be applied is computed as the presently-sensed erase voltage $V_{E2}$, because the difference between the new previously-permitted erase voltage $V_{E1}''$ (in this embodiment 4.8 V) and the presently-sensed erase voltage $V_{E2}$ (in this embodiment 5.0 V) is within the predefined maximum offset of 0.4 V.

The aforementioned processes may also be repeated for the second table 420 (concurrently or sequentially) in order to compute the erase voltages for the respective memory segment that is associated with the second table 420. Furthermore, each of the tables 418, 420, etc. may include only one row to reflect only the most recent previously-permitted erase voltage $V_{E1}$, the presently-sensed erase voltage $V_{E2}$, and the erase voltage $V_{Appl}$ to be applied. In such an instance, the data structure 400 may form a two-dimensional structure in which each row corresponds to a different memory segment of the memory array 106.

It is further noted that FIG. 4 illustrates one possible set of erase voltages which may be used in accordance with an embodiment of the invention, and those skilled in the art will appreciate that depending upon the memory structure and topology employed, other erase voltages may be used. The presented method extends to the above mentioned memory structures as well as to other erasable memory architectures, independent of the particular erase voltages employed.

FIG. 6 illustrates a method 600 for computing wear level scoring of a first memory segment in accordance with an embodiment of the invention.

Initially, at 602, a first nominal program/erase level associated with the first memory segment is provided. In an exemplary embodiment of this process, the data structure 400 illustrated in FIG. 4 is accessed, and an erase voltage table (e.g., the first table 418) corresponding to the memory segment is selected. From the erase voltage table (e.g., the first table 418), a previously-permitted erase voltage $V_{E1}$ is retrieved therefrom and serves as the first nominal program/erase voltage $V_{Nom1}$. In a particular embodiment, the last previously-permitted erase voltage $V_{E1}$ (i.e. the most recent previously-permitted erase voltage $V_{E1}$) is the value retrieved.

At 604, at least one second nominal program/erase voltage $V_{Nom2}$ associated with at least a second memory segment is provided. In an exemplary embodiment of this process, the data structure 400 illustrated in FIG. 4 is again accessed, and a second voltage table (e.g., the second table 420) corresponding to the second memory segment is selected. From the second voltage table, a previously-permitted erase voltage $V_{E1}$ is retrieved therefrom and serves as the second nominal program/erase voltage $V_{Nom2}$. In a particular embodiment, the last previously-permitted erase voltage $V_{E1}$ (i.e., the most recent previously-permitted erase voltage $V_{E1}$) is the value retrieved. Further similarly, a programming voltage may be used alternatively to the erase voltage.

Once the first nominal program/erase voltage $V_{Nom1}$ and the second nominal program/erase voltage $V_{Nom2}$ are retrieved, a wear level score for the first memory segment relative to the second memory segment is computed as a function of the difference between the first nominal program/erase voltage $V_{Nom1}$ and the second nominal program/erase voltage $V_{Nom2}$ at 606. In accordance with the exemplary embodiments of the processes 602 and 604, one embodiment of these processes is performed by computing the wear level score based upon the difference between the previously-permitted erase voltages from the first table 418 and the second table 420. In a specific embodiment, the wear level score takes into account the previously-permitted erase voltage $V_{E1}$, $V_{E1}'$, $V_{E1}''$, etc. In one embodiment of the invention, the current previously-permitted erase voltage $V_{E1}$, $V_{E1}'$, $V_{E1}''$, etc., is compared with one or a plurality of thresholds and according to the result, the respectively assigned memory segment is classified with regard to the usage thereof, e.g., as to whether the respectively assigned memory segment is allowed to be programmed at any time, as to whether, if possible, another memory segment should be used or as to whether the respectively assigned memory segment may rather merely be used as a read only memory segment. In an embodiment of the invention, it is determined as to whether the current previously-permitted erase voltage is in the range of about 4.0 V to about 5.0 V. If this is true, the respectively assigned memory segment is allowed to be programmed at any time, for example, at any time a programming request is received. If, however, this is wrong, it is determined as to whether the current previously-permitted erase voltage is in the range of about 5.0 V to about 5.5 V. If this is true, the respectively assigned memory segment, in response to a programming request, is determined as to whether wear leveling is possible or not, e.g. it is determined as to whether a memory segment is available, the respectively assigned current previously-permitted erase voltage is in the range of about 4.0 V to about 5.0 V, for example. If, however, this is wrong, it is determined as to whether the current previously-permitted erase voltage is higher than about 5.5 V. If this is true, the respectively assigned memory segment may be classified as rather merely to be used as a read only memory segment.

It should be mentioned that the wear leveling in this case is carried out based on the actual physical characteristic of the respective memory segments, which are represented by the current previously-permitted erase voltage, whereas in a conventional wear leveling, only the number of performed read or write cycles is taken into account. Furthermore, the actual stress being subjected to the respective memory segments is also taken into account, the actual stress also being represented by the current previously-permitted erase voltage.

It is to be noted that in the condition in which the nominal program/erase voltages are within a predefined range, then the wear level score of the first memory segment is substantially equivalent to the wear level score of the second memory segment.

In a further alternative embodiment of the process 600, the wear level score computation in 606 is further based upon the number of cycles the first memory segment undergoes relative to the second memory segment. In such an embodiment, the process 602 may include retrieving the cycle count from the fourth column 408 of the first table 418 in addition to the previously-permitted erase voltage from the first column 402 of the first table 418. The process of 604 may include retrieving a corresponding cycle count from the second table 420 for the second memory segment. The process of 606 may include comparing the cycle counts from the first table 418 (for the first memory segment) and from the second table 420 (for the second memory segment).

The aforementioned processes of 600 can be expanded to compute the wear level score of the first memory segment relative to each of n different memory segments. In such an embodiment, the process 604 may further include retrieving each of the n different nominal program/erase voltages corresponding to a respective memory segment of the n different memory segments. In addition, the process 606 may further include computing a wear level score for the first memory segment relative to each memory segment of the n different memory segments, wherein each wear level score of the plurality of wear level scores may be computed as a function of the difference between the first nominal program/erase voltage $V_{Nom1}$ and one respective nominal program/erase voltage $V_{Nomi}$ (i denoting an index of the respective i-th nominal program/erase voltage with I=1, . . . , n) of the n nominal program/erase voltages $V_{Nonm}$. It will be understood that the process could be conducted serially as well, whereby the processes 604 and 606 are repeated n times to retrieve each of the n different nominal program/erase voltages, and compute the wear level score of the first memory segment relative to the respective memory segment of the n different memory segments. Furthermore, similar processes can be performed to determine the wear level score of the second memory segment relative to the third memory segment through the n-th memory segment. A further process may be performed to determine the wear level score of the third memory segment relative to the fourth memory segment through the n-th memory segment, and so on. In this manner, each memory segment can be assigned a wear level score relative to each of the other memory segments.

Upon identifying a relative wear level score for each memory segment relative to each memory segment of the other memory segments, the memory segments may be ordered in terms of their wear level score, with the memory segment possessing the best relative wear level score (indicating the least wear) being placed first in the ordering, and the memory segment possessing the worst relative wear level score (indicating the most wear) being placed last in the ordering.

Several processes may be used to use the wear level ordered listing of memory segments. In one application in accordance with an embodiment of the invention, the memory segments are subsequently programmed and/or erased in time and frequency in accordance with their relative positioning in the wear level ordered listing in order to approach an equilibrium wear level score for all of the memory segments. In an application in accordance with another embodiment of the invention, the memory segment possessing the best wear level score may be reserved to store critical data, the identification of which may be made either manually, or through the recognition of the data type or the file type which is to be stored. By way of example, an executable file having, e.g., the file suffix ".exe" may be identified as a critical file. Of course, other processes whereby data is stored, e.g., using a wear level ordered listing of memory segments may be used in alternative embodiments of the invention.

FIG. 7 illustrates a further method 700 for ascertaining memory segment health.

Initially at 702, a first nominal program/erase voltage $V_{Nom1}$ and a second nominal program/erase voltage $V_{Nom2}$ associated with a memory segment are received.

At 704, a difference voltage $\Delta V_{Nom}$ is computed between the first nominal program/erase voltage $V_{Nom1}$ and the second nominal program/erase voltage $V_{Nom2}$. In an exemplary embodiment of these processes, the data structure 400 illustrated in FIG. 4 may be accessed, and an erase voltage table (e.g., the first table 418) corresponding to the respective memory segment is selected. From that erase voltage table (e.g., the first table 418), two previously-permitted erase voltages $V_{E1}$ are retrieved and selected as the first nominal program/erase voltage $V_{Nom1}$ and the second nominal program/erase voltage $V_{Nom2}$. By way of example, the entry of 2.0 V in the first column 402 and the first row 412 may be selected as the first nominal program/erase voltage $V_{Nom1}$, and the entry of 2.4 V in the first column 402 and the third row 416 may be selected as the second nominal program/erase voltage $V_{Nom2}$. Subsequently at 704, a nominal program/erase voltage difference $\Delta V_{Nom}$ is computed between the first nominal program/erase voltage $V_{Nom1}$ and the second nominal program/erase voltage $V_{Nom2}$. Following the illustrated embodiment above, the nominal program/erase voltage difference $\Delta V_{Nom}$ would be 0.5 V.

At 706, the cycle counts $Cycle_1$ and $Cycle_2$ corresponding to the first nominal program/erase voltage $V_{Nom1}$ and the second nominal program/erase voltage $V_{Nom2}$, respectively, are retrieved, and at 708, a cycle count difference $\Delta Cycle$ is computed as a difference between the cycle count $Cycle_1$ corresponding to the first nominal program/erase voltage $V_{Nom1}$ and the cycle count $Cycle_2$ corresponding to the second nominal program/erase voltage $V_{Nom2}$. These processes are similar to those processes 702 and 704, whereby the data structure 400 shown in FIG. 4 is accessed, and the erase voltage table (e.g. the first table 418) corresponding to the appropriate memory segment is selected. The cycle count entries in the fourth column 408 are retrieved, which in this embodiment of the invention would be 1,000 for the erase voltage of about 2.0 V and 10,000 for the erase voltage of about 2.4 V. It is to be understood that the processes 706 and 708 may be performed before or during the processes 702 and 704.

Once the difference voltage $\Delta V_{Nom}$ and the cycle count difference $\Delta$Cycle are computed, a memory segment health score is computed at 710 using both parameters. In a particular embodiment of this process, the memory segment health score is computed from the ratio of the voltage and cycle count differences according to the following equation:

$$\frac{\Delta V_{Nom}}{\Delta \text{Cycle}}.$$

This parameter provides a rate of degradation as to the change in the nominal program/erase voltage versus the number of program/erase cycles. The rate of degradation can be used to predict the anticipated lifetime of the particular memory segment assuming the current rate of degradation.

FIG. 8 illustrates a graph 800 showing the erase voltage as a function of the number of erase cycles for two different memory segments in accordance with an embodiment of the invention.

The vertical axis 802 represents the erase voltage of the memory segments, wherein the reference numeral 804 represents an erase voltage ceiling above which the memory segment will be deemed inoperable because erasure of the memory segment requires too high of a voltage to permit sufficient discrimination from a programming voltage level. The graph 800 further includes a horizontal axis 806 along which the number of erasure cycles is indicated.

Further included in the graph 800 are two responses, a first memory segment response 808 and a second memory segment response 810, each of which is computed in accordance with an embodiment of the invention. In a particular embodiment of the invention, the first memory segment response 808 and the second memory segment response 810 are computed using the following equation based upon their relative changes in nominal erase voltages and erase cycles:

$$\frac{\Delta V_{Nom}}{\Delta \text{Cycle}}.$$

As is shown in the graph 800 in FIG. 8, the first memory segment response 808 has a steeper slope and a faster rate of degradation compared to the second memory segment response 810. In addition, the first memory segment response 808 intersects the erase voltage ceiling 804 at approximately 10,000 erase cycles, well ahead of the second memory segment response 810 which intersects the erase voltage ceiling 804 at approximately 100,000 erase cycles. Accordingly, it can be expected that the first memory segment has a usable lifetime of approximately 10,000 erase cycles, whereas the second memory segment has a usable lifetime of approximately 100,000 erase cycles.

As can be gathered from FIG. 8 and the description above regarding the wear leveling, in an embodiment of the invention, it is no longer necessary to rely on a worst-case statistical assumption regarding the characteristics of the memory segments, but it is possible to classify those memory segments having bad characteristics very early as read only memory segments based on their actual physical characteristics, e.g., represented by their previously-permitted erase voltages. Thus, in average, the memory segments of a memory array in total achieve a higher endurance and life-time.

Differences in the semiconductor manufacturing process, operating conditions, and other affects may cause these relative differences in the erase cycle lifetimes of the memory segments.

The processes illustrated in FIG. 7 may be repeated at subsequent points to confirm the rate of degradation or to ascertain a new trend in the memory segment's degradation. Once the expected lifetime is determined, the memory segment can be earmarked with such information, and subsequently programmed/erased less often than more slowly degrading memory segments, and/or deselected from use upon approaching the computed memory segment erase cycle lifetime. With a priori knowledge as to the expected lifetime of the particular memory segment, greater device reliability can be achieved.

The term "circuit" used in the description is intended to include any kind of logic, hard-wired or programmable. In an embodiment of the invention, a "circuit" may be implemented by a programmable processor such as, e.g., a programmable microprocessor, wherein the respective functionality of the "circuit" is implemented using corresponding computer instruction code.

FIG. 9 shows a functional block diagram 900 of a memory arrangement in accordance with another embodiment of the invention.

The memory arrangement 900 is similar to the memory arrangement shown in FIG. 2 with a different peripheral memory and logic circuit 104. However, it should be mentioned that the following embodiments of the invention may be combined with the above described embodiments.

In this embodiment of the invention, the peripheral memory and logic circuit 104 includes a program/erase history table 902, which includes, for each memory segment, e.g., for each erase sector (which may include one or more memory pages) or even for some pages or for each page of each sector, an information about a previous program/erase operation.

In an embodiment of the invention, the information about a previous program/erase operation may include one or more of the following information for the respective sector or page:

a number of programming pulses provided in at least one previous program/erase operation of the memory segment, e.g., sector or page;

a number of erase pulses provided in the at least one previous program/erase operation of the memory segment, e.g., sector or page;

a number of program after erase pulses provided in the at least one previous program/erase operation of the memory segment, e.g., sector or page.

The memory arrangement 900 may further include a program/erase mode determining circuit 904 to determine a program/erase mode for programming or erasing a memory segment based on at least one previous program/erase operation, e.g., using the information stored in the program/erase history table 902.

In various embodiments of the invention, the program/erase mode determining circuit 904 may be configured to determine the program/erase mode on the basis of one or more of the following information 906:

at least one previous program/erase operation carried out on the memory segment; or at least one previous program/erase operation carried out on another memory segment.

The control circuit 102 stores, e.g., for each memory segment, e.g. for each memory page for each memory sector, the number of programming pulses or erase pulses used to program/erase the respective memory segment, e.g., the respective memory page of the respective memory sector, in the program/erase history table 902. In an embodiment of the invention, the control circuit 102 stores (alternatively or in addition), e.g., for each memory segment, e.g., for each memory page for each memory sector, the number of programming after erase pulses used to program the respective memory segment, e.g., the respective memory page of the respective memory sector, in the program/erase history table 902.

In a particular embodiment of the invention, the program/erase mode determining circuit 904 may be configured to determine the program/erase mode on the basis of one or more of the following information 906:
- at least one previous program/erase operation carried out on the same memory page of the memory segment; or
- at least one previous program/erase operation carried out on another memory page of the memory segment;
- at least one previous program/erase operation carried out on a memory page of another memory segment;
- at least one previous "program before erase" (PBE) operation carried out on another memory page of the memory segment;
- at least one previous "program before erase" (PBE) operation carried out on a memory page of another memory segment.

In an embodiment of the invention, at least two program/erase modes are provided, e.g.,
- a first program/erase mode, in which a memory page of the memory segment is programmed/erased based on a learn operation performed on a memory segment (e.g., a page) from another block, e.g., from another erase sector;
- a second program/erase mode, in which a memory page of the memory segment is programmed/erased based on a learn operation performed on a memory segment (e.g., a page) from the same block or the same erase sector In an embodiment of the invention, the learn operation may be performed on the first word of the page. In an embodiment of the invention, a VPPD level may be provided to achieve a program read-verify pass on a word. The VPPD level that is used to accomplish a program read-verify pass on that word may be used for the rest of the block, but, e.g., with a corresponding adjustment. This VPPD level may be used for the rest of the block and other blocks up to a certain time period, e.g., for a time period in the range from about 4 ms to about 15 ms, e.g., for a time period in the range from about 6 ms to about 10 ms.

In an embodiment of the invention, the learn operation may be carried out on a portion of a memory segment (e.g., of a portion of the blocks). The corresponding results may be applied to the remainder of the memory segments (e.g., to the remainder of the blocks) (e.g., depending on the program mode settings).

In an embodiment of the invention, illustratively, the program/erase mode determining circuit 904 determines, whether for programming/erasing of a respective memory segment, e.g., a memory sector, a continuous mode or a non-continuous mode should be selected, depending on the pre-stored information about previous program/erase operation, e.g., performed on another memory page previously programmed/erased of the current memory sector.

Thus, in an embodiment of the invention, a program learn operation is provided, when the area is on the verge of a reliability failure. When there are no issues, then the program/erase mode may be switched to the continuous mode, whereas in case there would be an issue, the program/erase mode may be switched to the non-continuous mode. Thus, in an embodiment of the invention, a program/erase operation may be improved in performance and reliability, e.g., since the program/erase operation is made dynamic. In an embodiment of the invention, the current state of a memory segment to be programmed/erased is taken into account before deciding on the necessity of a respective program/erase mode.

Furthermore, in an embodiment of the invention, the program/erase mode determining circuit 904 is configured such that it determines the program/erase mode to be used as described in the following paragraphs.

As shown in a flow diagram in 1000 in FIG. 10, upon receiving a program/erase request, e.g., from the control circuit 102, in 1002, in 1004, it is determined, how many erase pulses have been previously used to erase the previous memory page of the same erase memory sector (e.g., by reading the respective content of the program/erase history table 902). Furthermore, the number of program after erase pulses that have been previously used to program the previous memory page of the same erase memory sector (e.g., by reading the respective content of the program/erase history table 902) may be determined. In an embodiment of the invention, both parameters, the number of erase pulses and the number of program after erase pulses are determined.

Then, in 1006, it is determined whether the determined number (Num_of_Erase_Pulses) equals or exceeds a predefined number (X) of erase pulses for the respective memory segment, e.g., the respective memory sector.

If the determined number of erase pulses (Num_of_Erase_Pulses) equals to or exceeds the predefined number (X) of erase pulses for the respective memory segment, e.g. the respective memory sector ("Yes" in 1006), then, in 1008, the program/erase mode determining circuit 904 selects the non-continuous mode as the program/erase mode to be used and provides this information to the control circuit 102, which may then select the corresponding control process such that the respective memory segment is programmed using the non-continuous mode, in which different voltages may be used for programming each memory page of the memory sector.

If the determined number of erase pulses (Num_of_Erase_Pulses) does neither equal nor exceed the predefined number (X) of erase pulses for the respective memory segment, e.g., the respective memory sector ("No" in 1006), then, in 1010, the program/erase mode determining circuit 904 determines, if the determined number of program after erase pulses (Num_of_PAE_Pulses) equals to or exceeds the predefined number (Y) of program after erase pulses for the respective memory segment, e.g., the respective memory sector.

If the determined number of program after erase pulses (Num_of_PAE_Pulses) equals to or exceeds the predefined number (Y) of program after erase pulses for the respective memory segment, e.g., the respective memory sector ("Yes" in 1010), then, in 1008, the program/erase mode determining circuit 904 selects the non-continuous mode as the program/erase mode to be used and provides this information to the control circuit 102, which may then select the corresponding control process such that the respective memory segment is programmed using the non-continuous mode, in which different voltages may be used for programming each memory page of the memory sector.

If the determined number of program after erase pulses (Num_of_PAE_Pulses) does neither equal nor exceed the predefined number (Y) of program after erase pulses for the respective memory segment, e.g., the respective memory sector ("No" in 1010), then, in 1012, the program/erase mode determining circuit 904 selects the continuous mode as the program/erase mode to be used and provides this information to the control circuit 102, which may then select the corresponding control process such that the respective memory segment is programmed using the continuous mode, in which the same voltage may be used for programming each memory page of the memory sector.

Illustratively, in an embodiment of the invention, an option is provided to set a condition to evaluate the possibility to perform a continuous mode for programming for a memory segment, e.g., a memory sector, e.g., an erase sector, in an alternative embodiment of the invention, a memory segment of a predefined size of the memory array. Furthermore, a table (e.g., the program/erase history table 902) may be provided, wherein the table may contain the result of a predefined condition for each memory segment (e.g., a memory sector) or of a subgroup of a memory segment (such as, e.g., for a memory page of a memory sector) or for a memory segment of a predefined size of the memory array. This table and therewith the information included in the table is accessible before carrying out each programming operation in accordance with one embodiment of the invention.

In an embodiment of the invention, it has been recognized that the number of pulses required or used for erasing a memory segment and the number of pulses required or used for a program after an erase operation is a good indicator about the amount of over-programming of the memory cells included in the memory segment and the corresponding over-erase in the area under test.

In an embodiment of the invention, this information is used as a criteria to decide whether programming has to be performed carefully (with continuous mode deactivated and therefore, performing a program learn operation for the first word of a plurality of bits of each memory page, for example) or if use of a continuous mode as the program/erase mode to be used is feasible.

In an embodiment of the invention, the processes shown in FIG. 10 may be formulated in a pseudocode format as follows:

---

If [(Num_of_Erase_Pulses < X) OR (Num_of_PAE_Pulses < Y)]
    Then [Program_Mode is Continuous]
Else
    [Program_Mode is Non_Continuous]

---

Thus, information from each erase operation may be used to optimize the performance/reliability of the following programming operations on the memory array or memory segment.

In an embodiment of the invention, in the non-continuous mode, for each memory page, the number of pulses used for programming the first word of a plurality of bits (being stored in one or more memory cells) in the respective memory segment (e.g., in the respective memory erase sector) is used to determine the voltages used for programming the other words of a plurality of bits (being stored in one or more memory cells) in the same memory page. The voltages or number of pulses used for programming the words of a plurality of bits of the other memory pages will be respectively determined depending on the voltages or number of pulses used for programming the first word of a plurality of bits of that respective memory page.

In an embodiment of the invention, the control circuit 102 controls programming operations or erase operations or read operations on the memory cells of the memory array 106 by applying programming signals 208 to the memory cells of the memory array 106 and by receiving read signals 210 from the memory cells of the memory array 106. The programming operation is carried out in accordance of the determined program/erase mode 908 supplied by the program/erase mode determining circuit 904 to the control circuit 102.

In an embodiment of the invention, the result about the programming mode to be used can also be stored within the corresponding memory segment (e.g., the corresponding block) and reading of one bit or a plurality of bits (which represent(s) the information about the programming mode to be used) might determine the appropriate programming mode.

As shown in FIGS. 11A and 11B, in some embodiments, memory devices such as those described herein may be used in modules.

In FIG. 11A, a memory module 1100 is shown, on which one or more memory devices 1104 are arranged on a substrate 1102. The memory device 1104 may include numerous memory cells, each of which uses a memory element in accordance with an embodiment of the invention. The memory module 1100 may also include one or more electronic devices 1106, which may include memory, processing circuitry, control circuitry, addressing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices 1156, arranged on a stackable substrate 1154. The memory device 1156 contains memory cells that employ memory elements in accordance with an embodiment of the invention. The stackable memory module 1152 may also include one or more electronic devices 1158, which may include memory, processing circuitry, control circuitry, addressing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In an embodiment of the invention, an integrated circuit having a memory controller is provided. The memory controller may include a first determining circuit to determine a first level for programming or erasing a memory segment as a function of an initial program/erase level, a second determining circuit to determine a first updated level for a subsequent program/erase operation of the memory segment, and a third determining circuit to determine a second level for programming or erasing the memory segment subsequent to programming or erasing the memory segment using the first level, wherein the second level is determined as a function of the first updated level.

In this embodiment, the initial program/erase level may be a predefined erase level.

Further in this embodiment, the first determining circuit may be configured to attempt to program or erase the memory segment using a first candidate program/erase level, adjust the first candidate program/erase level to a second candidate program/erase level in case the attempt to program or erase the memory segment using the first candidate program/erase level has not been successful, attempt to program or erase the memory segment using the second candidate program/erase level, and define the second candidate program/erase level as the first level in case the program or erase of the memory segment using the second candidate program/erase level has been successful.

Further in this embodiment, the first determining circuit may be configured to adjust the first candidate program/erase level to the second candidate program/erase level by adjusting the voltage magnitude of the first candidate program/erase level.

In an example of this embodiment, the first determining circuit may be configured to adjust the first candidate program/erase level to the second candidate program/erase level by adjusting the pulse width of the first candidate program/erase level.

In another example of this embodiment, the first determining circuit may be configured to adjust the first candidate program/erase level to the second candidate program/erase level by adjusting the pulse repetition rate of the first candidate program/erase level.

In yet another example of this embodiment, the second determining circuit is configured to determine the first updated level as a function of the difference between the first level and the initial program/erase level.

Further in this embodiment, the second determining circuit may be configured to determine the first updated level as a predefined offset from the initial program/erase level when the difference between the first level and the initial program/erase level exceeds a predefined threshold.

Further in this embodiment, the second determining circuit is configured to determine the first updated level as a predefined offset from the initial program/erase level when the difference between the first level and the initial program/erase level does not exceed a predefined threshold.

Further in this embodiment, the second determining circuit may be configured to determine the first updated level as an average value of the first level and the initial program/erase level.

In another embodiment of the invention, a memory controller is provided. The memory controller may include a first determining circuit to determine a first level for programming or erasing a memory segment as a function of an initial program/erase level, a second determining circuit to determine a first updated level for a subsequent program/erase operation of the memory segment, and a third determining circuit to determine a second level for programming or erasing the memory segment subsequent to programming or erasing the memory segment using the first level, wherein the second level is determined as a function of the first updated level.

In yet another embodiment of the invention, a method for determining a level for programming or erasing a memory segment is provided. The method may include determining a first level for programming or erasing a memory segment as a function of an initial program/erase level, determining a first updated level for a subsequent program/erase operation of the memory segment, and determining a second level for programming or erasing the memory segment subsequent to programming or erasing the memory segment using the first level, wherein the second level is determined as a function of the first updated level.

In this embodiment, the initial program/erase level may be a predefined erase level.

Further in this embodiment, the determining the first level for programming or erasing the memory segment as a function of the initial program/erase level may include attempting to program or erase the memory segment using a first candidate program/erase level, adjusting the first candidate program/erase level to a second candidate program/erase level in case the attempt to program or erase the memory segment using the first candidate program/erase level has not been successful, attempting to program or erase the memory segment using the second candidate program/erase level, and defining the second candidate program/erase level as the first level in case the program or erase of the memory segment using the second candidate program/erase level has been successful.

Further in accordance with this embodiment, the first candidate program/erase level may be adjusted to the second candidate program/erase level by adjusting the voltage magnitude of the first candidate program/erase level.

In an example of this embodiment, the first candidate program/erase level may be adjusted to the second candidate program/erase level by adjusting the pulse width of the first candidate program/erase level and/or by adjusting the pulse repetition rate of the first candidate program/erase level.

Further in accordance with this embodiment, the first updated level may be determined as a function of the difference between the first level and the initial program/erase level.

Further in accordance with this embodiment, the first updated level may be determined as a predefined offset from the initial program/erase level when the difference between the first level and the initial program/erase level exceeds a predefined threshold.

Further in accordance with this embodiment, the first updated level may be determined as a predefined offset from the initial program/erase level when the difference between the first level and the initial program/erase level does not exceed a predefined threshold.

Furthermore, in this embodiment, the first updated level may be determined as an average value of the first level and the initial program/erase level.

In yet another embodiment of the invention, an integrated circuit having a memory controller is provided. The memory controller may include a wear level score determining circuit to determine a wear level score for a memory segment, wherein the wear level score determining circuit is configured to determine a first nominal program/erase level associated with the memory segment, and determine a wear level score for the memory segment relative to at least one other memory segment, wherein the wear level score for the memory segment is determined as a function of the difference between the first nominal program/erase level and a second nominal program/erase level associated with the at least one other memory segment.

In this embodiment, the wear level score determining circuit may be configured to determine the second nominal program/erase level associated with the at least one other memory segment.

In an example of this embodiment of the invention, the wear level score determining circuit may be configured to determine the wear level score further taking into account the number of programming operations or erase operations or a combination of programming operations and erase operations which the memory segment has undergone.

In this embodiment, the integrated circuit may further include a wear level score ordering circuit to order the wear level scores of the memory segment and of the at least one other memory segment, and a memory segment selection circuit to select the memory segment to store received data to be stored in accordance with the determined order.

In another example of this embodiment of the invention, the memory segment selection circuit may be configured to select the memory segment to store received data to be stored further based upon the type of the received data to be stored.

In yet another embodiment of the invention, a memory controller is provided. The memory controller may include a wear level score determining circuit to determine a wear level score for a memory segment, wherein the wear level score determining circuit is configured to determine a first nominal program/erase level associated with the memory segment, and determine a wear level score for the memory segment relative to at least one other memory segment, wherein the wear level score for the memory segment is determined as a function of the difference between the first nominal program/erase level and a second nominal program/erase level associated with the at least one other memory segment.

In yet another embodiment of the invention, a method for determining a wear level score for a memory segment is provided. The method may include determining a first nominal program/erase level associated with the memory segment, and determining a wear level score for the memory segment relative to at least one other memory segment, wherein the wear level score for the memory segment is determined as a function of the difference between the first nominal program/erase level and a second nominal program/erase level associated with the at least one other memory segment.

In this embodiment, the method may further include determining the second nominal program/erase level associated with the at least one other memory segment.

Further in this embodiment, the wear level score may be determined further taking into account the number of programming operations or erase operations or a combination of programming operations and erase operations which the memory segment has undergone.

In this embodiment, the method may further include ordering the wear level scores of the memory segment and of the at least one other memory segment, and selecting the memory segment to store received data to be stored in accordance with the determined order.

Furthermore, in an example of this embodiment of the invention, the memory segment may be selected to store received data to be stored further based upon the type of the received data to be stored.

In yet another embodiment of the invention, an integrated circuit having a memory arrangement is provided. The memory arrangement may include a plurality of memory segments and a memory controller coupled to the memory segments. The memory controller may include a first determining circuit to determine a first level for programming or erasing a memory segment as a function of an initial program/erase level, a second determining circuit to determine a first updated level for a subsequent program/erase operation of the memory segment, and a third determining circuit to determine a second level for programming or erasing the memory segment subsequent to programming or erasing the memory segment using the first level, wherein the second level is determined as a function of the first updated level.

In yet another embodiment of the invention, a memory module is provided. The memory module may include a plurality of integrated circuits, wherein at least one integrated circuit of the plurality of integrated circuits includes a cell arrangement. The cell arrangement may include a plurality of memory segments, and a memory controller coupled to the memory segments. The memory controller may include a first determining circuit to determine a first level for programming or erasing a memory segment as a function of an initial program/erase level, a second determining circuit to determine a first updated level for a subsequent program/erase operation of the memory segment, and a third determining circuit to determine a second level for programming or erasing the memory segment subsequent to programming or erasing the memory segment using the first level, wherein the second level is determined as a function of the first updated level.

The memory module may be a stackable memory module in which at least some of the integrated circuits are stacked one above the other.

In yet another embodiment of the invention, an integrated circuit having a memory arrangement is provided. The memory arrangement may include a plurality of memory segments, and a memory controller coupled to the memory segments. The memory controller may include a wear level score determining circuit to determine a wear level score for a memory segment, wherein the wear level score determining circuit is configured to determine a first nominal program/erase level associated with the memory segment, and determine a wear level score for the memory segment relative to at least one other memory segment, wherein the wear level score for the memory segment is determined as a function of the difference between the first nominal program/erase level and a second nominal program/erase level associated with the at least one other memory segment.

In yet another embodiment of the invention, a memory module is provided. The memory module may include a plurality of integrated circuits, wherein at least one integrated circuit of the plurality of integrated circuits may include a cell arrangement. The cell arrangement may include a wear level score determining circuit to determine a wear level score for a memory segment, wherein the wear level score determining circuit is configured to determine a first nominal program/erase level associated with the memory segment, and determine a wear level score for the memory segment relative to at least one other memory segment, wherein the wear level score for the memory segment is determined as a function of the difference between the first nominal program/erase level and a second nominal program/erase level associated with the at least one other memory segment.

The memory module may be a stackable memory module in which at least some of the integrated circuits are stacked one above the other.

In yet another embodiment of the invention, an integrated circuit having a memory controller means is provided. The memory controller means may include a first determining means for determining a first level for programming or erasing a memory segment as a function of an initial program/erase level, a second determining means for determining a first updated level for a subsequent program/erase operation of the memory segment, and a third determining means for determining a second level for programming or erasing the memory segment subsequent to programming or erasing the memory segment using the first level, wherein the second level is determined as a function of the first updated level.

In yet another embodiment of the invention, an integrated circuit having a memory controller means is provided. The memory controller means may include a wear level score determining means for determining a wear level score for a memory segment, wherein the wear level score determining means is configured to determine a first nominal program/erase level associated with the memory segment, and determine a wear level score for the memory segment relative to at least one other memory segment, wherein the wear level score for the memory segment is determined as a function of the difference between the first nominal program/erase level and a second nominal program/erase level associated with the at least one other memory segment.

In yet another embodiment of the invention, an integrated circuit having a memory controller is provided. The memory controller may include a program/erase mode determining circuit to determine a program/erase mode for programming or erasing a memory segment based on at least one previous program/erase operation, and a controller configured to program/erase the memory segment in accordance with the determined program/erase mode.

In this embodiment of the invention, the memory segment may be a memory sector comprising one or a plurality of memory pages.

Further in this embodiment of the invention, the controller may be configured to program/erase at least some of the memory pages using different voltages.

Further in this embodiment of the invention, the program/erase mode determining circuit may be configured to determine a program/erase mode for programming or erasing a memory segment based on at least one previous program/erase operation carried out on the memory segment, or at least one previous program/erase operation carried out on another memory segment.

Further in this embodiment of the invention, the program/erase mode determining circuit may be configured to determine a program/erase mode for programming or erasing a memory segment based on at least one previous program/erase operation carried out on the same memory page of the memory segment, or at least one previous program/erase operation carried out on another memory page of the memory segment, or at least one previous program/erase operation carried out on a memory page of another memory segment.

Furthermore, in this embodiment, the program/erase mode determining circuit may be configured to determine a program/erase mode for programming or erasing a memory segment based on at least one of the following criteria provided in the at least one previous program/erase operation: a number of programming pulses provided in the at least one previous program/erase operation, a number of erase pulses provided in the at least one previous program/erase operation, a number of program after erase pulses provided in the at least one previous program/erase operation.

Furthermore, in this embodiment, the program/erase mode may include a first program/erase mode, in which a memory page of the memory segment is programmed/erased based on a learn operation performed on a memory segment from another memory block or from another erase sector, or a second program/erase mode, in which a memory page of the memory segment is programmed/erased based on a learn operation performed on a memory segment of the same memory block or of the same erase sector.

In yet another embodiment of the invention, a method for operating an integrated circuit having a memory controller is provided. The method may include determining a program/erase mode for programming or erasing a memory segment based on at least one previous program/erase operation, and programming/erasing the memory segment in accordance with the determined program/erase mode.

In this embodiment, the memory segment may be a memory sector having one or a plurality of memory pages.

Further in this embodiment of the invention, at least some of the memory pages are programmed/erased using different voltages.

Further in this embodiment of the invention, the program/erase mode for programming or erasing a memory segment may be determined based on at least one previous program/erase operation carried out on the memory segment, or at least one previous program the memory module is a stackable memory module in which at least some of the integrated circuits are stacked one above the other program/erase operation carried out on another memory segment.

Further in accordance with this method, the program/erase mode for programming or erasing a memory segment may be determined based on at least one previous program/erase operation carried out on the same memory page of the memory segment, or at least one previous program/erase operation carried out on another memory page of the memory segment, or at least one previous program/erase operation carried out on a memory page of another memory segment.

Furthermore, in this embodiment, the program/erase mode for programming or erasing a memory segment may be determined based on at least one of the following criteria provided in the at least one previous program/erase operation: a number of programming pulses provided in the at least one previous program/erase operation, a number of erase pulses provided in the at least one previous program/erase operation, and a number of program after erase pulses provided in the at least one previous program/erase operation.

In an example of this embodiment, the program/erase mode may include a first program/erase mode, in which a memory page of the memory segment is programmed/erased based on a learn operation performed on a memory segment from another memory block or from another erase sector, or a second program/erase mode, in which a memory page of the memory segment is programmed/erased based on a learn operation performed on a memory segment of the same memory block or of the same erase sector.

In yet another embodiment of the invention, a memory module is provided. The memory module may include a plurality of integrated circuits, wherein at least one integrated circuit of the plurality of integrated circuits may include a memory controller. The memory controller may include a program/erase mode determining circuit to determine a program/erase mode for programming or erasing a memory segment based on at least one previous program/erase operation, and a controller configured to program/erase the memory segment in accordance with the determined program/erase mode.

The memory module may be a stackable memory module in which at least some of the integrated circuits are stacked one above the other.

While embodiments of the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a memory controller, the memory controller comprising:
 a first determining circuit to determine a first level for programming or erasing a memory segment as a function of an initial program/erase level;

a second determining circuit to determine a first updated level for a subsequent program/erase operation of the memory segment; and a third determining circuit to determine a second level for programming or erasing the memory segment subsequent to programming or erasing the memory segment using the first level, wherein the second level is determined as a function of the first updated level.

2. The integrated circuit of claim 1, wherein the initial program/erase level is a predefined erase level.

3. The integrated circuit of claim 1, wherein the first determining circuit is configured to:
attempt to program or erase the memory segment using a first candidate program/erase level;
adjust the first candidate program/erase level to a second candidate program/erase level in case the attempt to program or erase the memory segment using the first candidate program/erase level has not been successful;
attempt to program or erase the memory segment using the second candidate program/erase level; and
define the second candidate program/erase level as the first level in case the to program or erase the memory segment using the second candidate program/erase level has been successful.

4. The integrated circuit of claim 3, wherein the first determining circuit is configured to adjust the first candidate program/erase level to the second candidate program/erase level by adjusting at least one parameter selected from the group consisting of:
a voltage magnitude of the first candidate program/erase level;
a pulse width of the first candidate program/erase level; and
a pulse repetition rate of the first candidate program/erase level.

5. The integrated circuit of claim 1, wherein the second determining circuit is configured to determine the first updated level as a function of a difference between the first level and the initial program/erase level.

6. The integrated circuit of claim 5, wherein the second determining circuit is configured to determine the first updated level as a predefined offset from the initial program/erase level when the difference between the first level and the initial program/erase level exceeds a predefined threshold.

7. A method for determining a level for programming or erasing a memory segment, the method comprising:
determining a first level for programming or erasing a memory segment as a function of an initial program/erase level;
determining a first updated level for a subsequent program/erase operation of the memory segment; and
determining a second level for programming or erasing the memory segment subsequent to programming or erasing the memory segment using the first level, wherein the second level is determined as a function of the first updated level.

8. The method of claim 7, wherein the initial program/erase level is a predefined erase level.

9. The method of claim 7, wherein determining the first level for programming or erasing the memory segment as a function of the initial program/erase level comprises:
attempting to program or erase the memory segment using a first candidate program/erase level;
adjusting the first candidate program/erase level to a second candidate program/erase level in case the attempt to program or erase the memory segment using the first candidate program/erase level has not been successful;
attempting to program or erase the memory segment using the second candidate program/erase level; and
defining the second candidate program/erase level as the first level in case the to program or erase the memory segment using the second candidate program/erase level has been successful.

10. The method of claim 9, wherein the first candidate program/erase level is adjusted to the second candidate program/erase level by adjusting at least one parameter selected from the group consisting of:
a voltage magnitude of the first candidate program/erase level;
a pulse width of the first candidate program/erase level; and
a pulse repetition rate of the first candidate program/erase level.

11. The method of claim 7, wherein the first updated level is determined as a function of the difference between the first level and the initial program/erase level.

12. An integrated circuit comprising a memory controller, the memory controller comprising:
a wear level score determining circuit to determine a wear level score for a memory segment, wherein the wear level score determining circuit is configured to:
determine a first nominal program/erase level associated with the memory segment; and
determine the wear level score for the memory segment relative to at least one other memory segment, wherein the wear level score for the memory segment is determined as a function of the difference between the first nominal program/erase level and a second nominal program/erase level associated with the at least one other memory segment.

13. The integrated circuit of claim 12, wherein the wear level score determining circuit is configured to determine the second nominal program/erase level associated with the at least one other memory segment.

14. The integrated circuit of claim 12, wherein the wear level score determining circuit is configured to determine the wear level score further taking into account the number of programming operations or erase operations or a combination of programming operations and erase operations which the memory segment has undergone.

15. The integrated circuit of claim 12, further comprising:
a wear level score ordering circuit to order the wear level scores of the memory segment and of the at least one other memory segment; and
a memory segment selection circuit to select the memory segment to store received data to be stored in accordance with a determined order.

16. The integrated circuit of claim 15, wherein the memory segment selection circuit is configured to select the memory segment to store received data to be stored further based upon the type of the received data to be stored.

17. A method for determining a wear level score for a memory segment, the method comprising:
determining a first nominal program/erase level associated with the memory segment; and
determining a wear level score for the memory segment relative to at least one other memory segment, wherein the wear level score for the memory segment is determined as a function of a difference between the first nominal program/erase level and a second nominal program/erase level associated with the at least one other memory segment.

18. The method of claim 17, further comprising determining the second nominal program/erase level associated with the at least one other memory segment.

19. The method of claim 17, wherein the wear level score is determined further taking into account the number of programming operations or erase operations or a combination of programming operations and erase operations which the memory segment has undergone.

20. The method of claim 17, further comprising:
ordering the wear level scores of the memory segment and of the at least one other memory segment; and
selecting the memory segment to store received data to be stored in accordance with a determined order.

21. The method of claim 20, wherein the memory segment is selected to store received data to be stored further based upon the type of the received data to be stored.

* * * * *